US010305400B2

(12) United States Patent
Cai et al.

(10) Patent No.: US 10,305,400 B2
(45) Date of Patent: May 28, 2019

(54) MAGNETIC SENSOR INTEGRATED CIRCUIT, MOTOR ASSEMBLY AND APPLICATION DEVICE

(71) Applicant: JOHNSON ELECTRIC INTERNATIONAL AG, Murten (CH)

(72) Inventors: Guang Jie Cai, Hong Kong (CN); Chun Fai Wong, Hong Kong (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 0 days.

(21) Appl. No.: 15/491,254

(22) Filed: Apr. 19, 2017

(65) Prior Publication Data

US 2017/0310253 A1    Oct. 26, 2017

(30) Foreign Application Priority Data

Apr. 20, 2016  (CN) .......................... 2016 1 0248168
Jun. 3, 2016   (CN) .......................... 2016 1 0396778

(51) Int. Cl.
| | |
|---|---|
| *H02K 29/08* | (2006.01) |
| *H02P 6/16* | (2016.01) |
| *H02K 11/215* | (2016.01) |
| *G01R 33/07* | (2006.01) |
| *G01R 33/00* | (2006.01) |

(52) U.S. Cl.
CPC ............ *H02P 6/16* (2013.01); *G01R 33/0082* (2013.01); *G01R 33/07* (2013.01); *H02K 11/215* (2016.01)

(58) Field of Classification Search
CPC ....... H02P 6/16; G01R 33/07; G01R 33/0082; H02K 11/215
USPC .................................................... 318/400.38
See application file for complete search history.

(56) References Cited

U.S. PATENT DOCUMENTS

| | | | | |
|---|---|---|---|---|
| 4,135,120 | A * | 1/1979 | Hoshimi ................... | H02P 6/06 318/400.04 |
| 4,392,101 | A * | 7/1983 | Saar ....................... | H01M 10/44 320/125 |
| 2003/0107509 | A1* | 6/2003 | Drossel ................... | G01L 19/12 341/155 |
| 2010/0259315 | A1* | 10/2010 | Lin ........................... | G05F 3/08 327/538 |
| 2013/0099770 | A1* | 4/2013 | Cheng ....................... | G05F 3/30 323/313 |
| 2016/0155547 | A1* | 6/2016 | Yuan ........................ | H01C 7/06 338/9 |

* cited by examiner

*Primary Examiner* — Eduardo Colon Santana
*Assistant Examiner* — Gabriel Agared
(74) *Attorney, Agent, or Firm* — Muncy, Geissler, Olds & Lowe, P.C.

(57) ABSTRACT

A magnetic sensor integrated circuit is provided, which includes: a magnetic sensing element to detect change in an external magnetic field to output a magnetic field sensing signal; a signal processor to process the magnetic field sensing signal and output a magnetic field detection signal; and a current source generator to output a constant current to the magnetic sensing element. The constant current is not influenced by a temperature.

14 Claims, 8 Drawing Sheets

FIG. 8

MAGNETIC SENSOR INTEGRATED CIRCUIT, MOTOR ASSEMBLY AND APPLICATION DEVICE

CROSS REFERENCE TO RELATED APPLICATIONS

This non-provisional patent application claims priority under 35 U.S.C. § 119(a) from Patent Application No. 201610248168.3 filed in the People's Republic of China on Apr. 20, 2016 and 201610396778.8 filed in the People's Republic of China on Jun. 3, 2016.

TECHNICAL FIELD

The present disclosure relates to the technical field of integrated circuit design, and in particular to a magnetic sensor integrated circuit, a current source generator, a motor assembly applying the magnetic sensor integrated circuit, and an application device applying the motor assembly.

BACKGROUND

A magnetic sensor, such as a Hall element is widely applied in modern industries and electronic products to induce a magnetic field strength for measuring physical parameters such as current, position and direction. The motor is an important application field of magnetic sensor. The magnetic sensor may serve as a rotor magnetic-pole position sensor in the motor. As a Hall element is generally made of semiconductor material and a constant voltage is applied to the Hall element to drive the Hall element, a sensitivity of the Hall element changes apparently when a temperature changes.

SUMMARY

A magnetic sensor integrated circuit and a current source generator are provided according to the present disclosure, so as to solve a problem in the conventional technology that an additional temperature compensating circuit is required to compensate a Hall signal while a conventional temperature compensating circuit has a complicated design and occupies a great space of an integrated circuit.

In order to achieve the above object, the following technical solutions are provided according to the present disclosure.

A magnetic sensor integrated circuit is provided, which includes a magnetic sensing element to detect a polarity of an external magnetic field and outputting a magnetic sensing signal, a signal processor to process the magnetic field sensing signal and output a magnetic field detection signal, and a current source generator to output a constant current to the magnetic sensing element. The constant current is not influenced by a temperature.

Preferably, the current source generator comprises a voltage source outputting a reference voltage; and a temperature compensating resistor connected to the voltage source, wherein the voltage source outputs the constant current to the magnetic sensing element via the temperature compensating resistor.

Preferably, the voltage source can be a bandgap reference voltage source which converts a direct current voltage and output the reference voltage.

Preferably, the current source generator may further include at least one ordinary resistor connected in parallel with the temperature compensating resistor, where the voltage source outputs at least one current via the at least one ordinary resistor.

Preferably, the temperature compensating resistor may include a positive temperature coefficient compensating resistor and a negative temperature coefficient compensating resistor connected in series.

Preferably, the positive temperature coefficient compensating resistor may be a first doping type of polysilicon resistor, and the negative temperature coefficient compensating resistor may be a second doping type of polysilicon resistor.

Preferably, the bandgap reference voltage source may be a bipolar junction transistor core circuit.

Preferably, the bipolar junction transistor core circuit may include at least two triodes.

Preferably, the signal processor may include an amplifier amplifying the magnetic field sensing signal; a switched capacitor filter sampling and filtering the magnetic sensing signal to eliminate a deviation signal; and an analog-to-digital converter converting a filtered signal processed by the switched capacitor filter into a switch-type detection signal.

Preferably, the amplifier may be a chopper amplifier.

Preferably, the magnetic sensing element is a Hall element.

Preferably, the magnetic sensor integrated circuit may further include: an AC-DC converter converting an alternating current voltage into a direct current voltage and providing the direct current voltage for the current source generator.

A motor assembly is provided, which includes: a motor powered by an alternating current power supply; a bidirectional switch connected in series with the motor; and the magnetic sensor integrated circuit described above, where an output port of the magnetic sensor integrated circuit is electrically connected to a control terminal of the bidirectional switch.

Correspondingly, an application device including the motor component is further provided according to the present disclosure.

Optionally, the appliance device may be a pump, a fan, a household appliance or a vehicle.

With the technical solutions described above, the magnetic sensing element in the magnetic sensor integrated circuit according to the present disclosure receives the constant current which is not influenced by change in a temperature, and sensitivity of the magnetic sensing element is basically not influenced by the temperature when being driven by the constant current. Therefore, compared with the conventional technology, no additional temperature compensating circuit is required by the magnetic sensor integrated circuit according to the present disclosure to perform temperature compensation on a Hall signal, and the compensating circuit has a simple design and occupies a small space of the integrated circuit.

BRIEF DESCRIPTION OF THE DRAWINGS

In order to illustrate technical solutions in embodiments of the present disclosure or in the conventional technology more clearly, drawings used in the descriptions of the embodiments or the conventional technology are introduced briefly hereinafter. Apparently, the drawings described hereinafter merely illustrate some embodiments of the present disclosure, and other drawings may be obtained by those skilled in the art based on those drawings without any creative efforts.

DETAILED DESCRIPTION OF EMBODIMENTS

Technical solutions in embodiments of the present disclosure are described clearly and completely hereinafter in conjunction with the drawings of the embodiments of the present disclosure. Apparently, the described embodiments are only a few rather than all of the embodiments of the invention. All other embodiments obtained by those skilled in the art based on the embodiments of the present disclosure without any creative efforts fall within the protection scope of the present disclosure.

In a case of a Hall element is driven by a constant voltage, a sensitivity of a Hall element changes greatly when a temperature changes, thus a Hall signal has a severe distortion. In a case of the Hall element is driven by a constant current, the sensitivity of the Hall element changes a little when the temperature changes, that is, the sensitivity of the Hall element hardly changes as the temperature changes.

Figure 1:
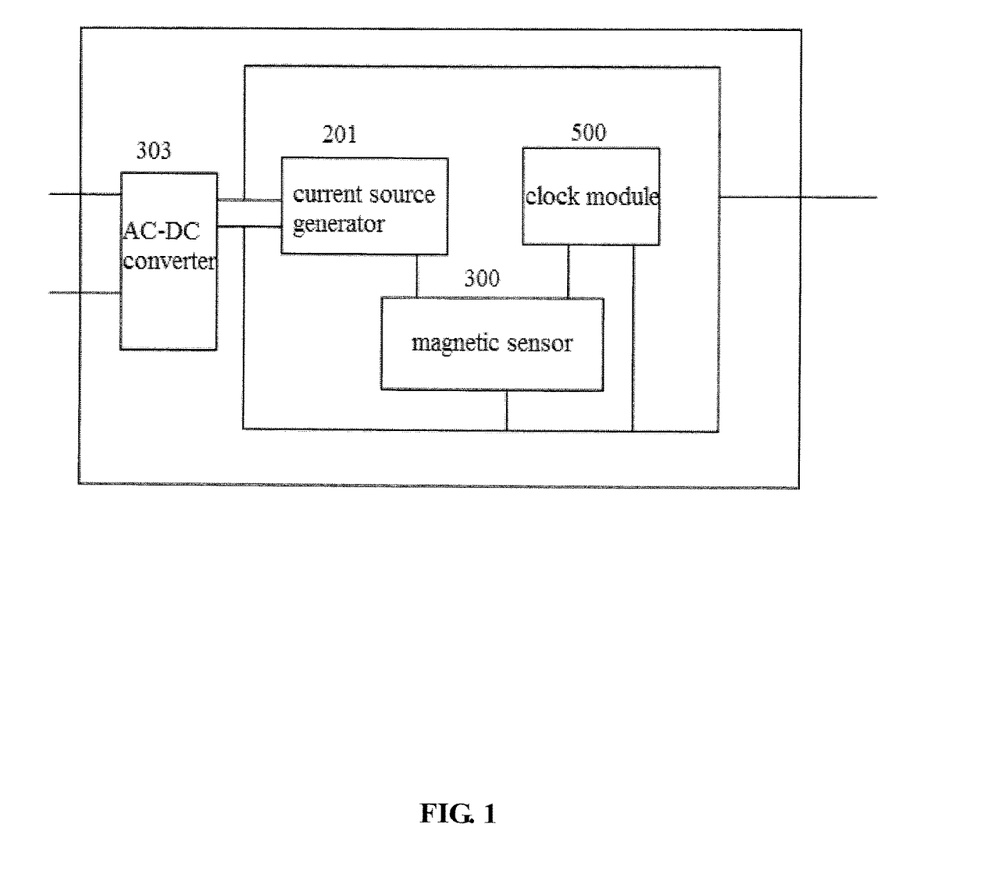
FIG. 1 shows an overall schematic structural diagram of a magnetic sensor integrated circuit according to one embodiment.

A current source generator according to the present disclosure is applied to a magnetic sensor integrated circuit, and is configured to provide a current for a magnetic sensing module. Specifically, FIG. 1 shows an overall schematic structural diagram of a magnetic sensor integrated circuit 400 according to one embodiment. The magnetic sensor integrated circuit 400 is connected to an alternating current power supply, and outputs a control signal to a bidirectional controlled alternating current switch according to a polarity of an external magnetic field. The magnetic sensor integrated circuit 400 includes: an AC-DC converter 303, a current source generator 201, a magnetic sensor 300 and a clock module 500. The AC-DC converter is configured to concert an alternating current voltage into a low direct-current voltage, and supply power to the magnetic sensing module and the clock module. The current source generator outputs multiple currents according to the low direct-current voltage. The magnetic sensor is configured to detect change in the external magnetic field, and output the control signal according to the change in the magnetic field. The clock module is configured to provide a clock signal for the magnetic sensor.

Figure 2:
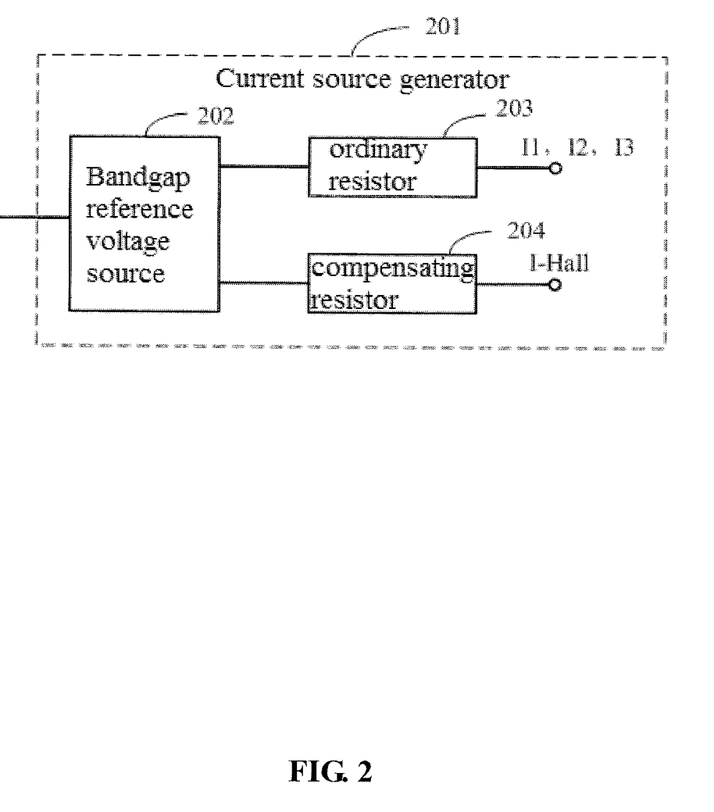
FIG. 2 is a schematic structural diagram of a current source generator according to one embodiment.

FIG. 2 shows a schematic structural diagram of a current source generator according to one embodiment. As shown in FIG. 2, the current source generator 201 according to the present disclosure includes: a bandgap reference voltage source 202 configured to output a reference voltage; and at least one ordinary resistor 203 connected to the bandgap reference voltage source 202, where the bandgap reference voltage source 202 outputs at least one current I1, I2 and I3 via the at least one ordinary resistor 203; and a temperature compensating resistor 204 connected to the bandgap reference voltage source 202, where the bandgap reference voltage source 202 outputs a constant current I-Hall via the temperature compensating resistor 204.

The temperature compensating resistor includes a positive temperature coefficient compensating resistor and a negative temperature coefficient compensating resistor connected in series. Resistances of the positive temperature coefficient compensating resistor and the negative temperature coefficient compensating resistor are set to eliminate influence on a resistance from change in a temperature. That is, the resistance of the temperature compensating resistor does not change when a temperature of the magnetic sensor integrated circuit changes. The positive temperature coefficient compensating resistor is a first doping type of polysilicon resistor. The negative temperature coefficient compensating resistor is a second doping type of polysilicon resistor. In the embodiment, the first doping type of polysilicon resistor is an N+ type of polysilicon resistor, and the second doping type of polysilicon resistor is a P+ type polysilicon resistor.

The bandgap reference voltage source includes a bipolar junction transistor core circuit. The bipolar junction transistor core circuit includes at least two triodes. An area of an emitter of one triode is at least two times of an area of an emitter of another triode.

In the current source generator according to the present disclosure, the temperature compensating resistor connected to the bandgap reference voltage source is included. The bandgap reference voltage source outputs the constant current via the temperature compensating resistor. According to the present disclosure, the temperature compensating resistor is connected in series with the bandgap reference voltage source. In this way, the constant current which is not influenced by the temperature is outputted to the magnetic sensing element via the temperature compensating resistor, and the sensitivity of the magnetic sensing element is hardly influenced by the temperature when being driven by the constant current.

With the current source generator according to the embodiment, in normal operation, the bandgap reference voltage source provided with the bipolar junction transistor core circuit supplies a stable and highly accurate reference voltage of 1.25V, and provides a stable reference bias current to the magnetic sensor.

Figure 3:
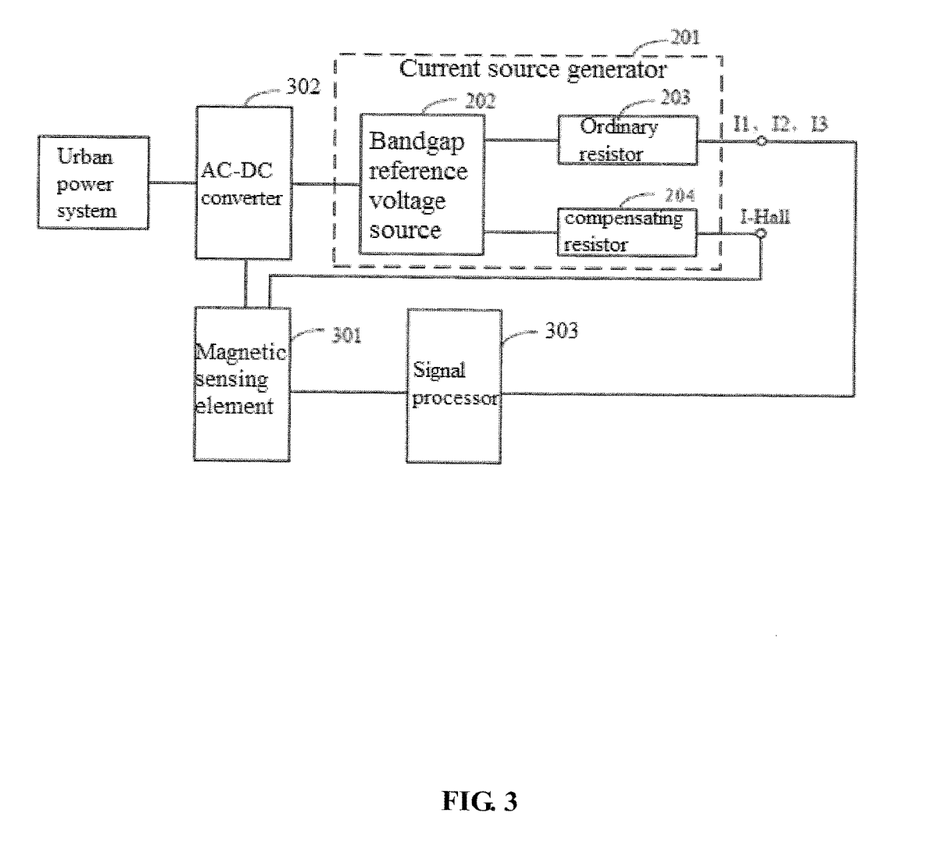
FIG. 3 is a schematic structural diagram of a magnetic sensor integrated circuit according to one embodiment.

FIG. 3 shows a schematic structural diagram of a magnetic sensor integrated circuit 400 according to one embodiment. The magnetic sensor integrated circuit 400 is configured to sense a polarity of a magnetic field and output a control signal. The magnetic sensor integrated circuit includes the current source generator 201 according to the above embodiments, a magnetic sensing element 301 and a signal processor 303.

The magnetic sensing element 301 is configured to detect the external magnetic field and output a magnetic field sensing signal. The signal processor 302 is configured to process the magnetic field sensing signal and output the control signal. The current source generator 201 includes a bandgap reference voltage source 202, at least one resistor 203, and a temperature compensating resistor 204. The current source generator 201 is configured to receive a direct current voltage, output a constant current to the magnetic sensing element 301, and output a current to the signal processor 303. The magnetic sensing element 301 is driven by a constant current I-Hall outputted by the current source generator 201.

In the embodiment, the temperature compensating resistor is connected in series with the bandgap reference voltage source. In this way, a constant current which is not influenced by the temperature is outputted to the magnetic sensing element, and sensitivity of the magnetic sensing element is hardly influenced by the temperature when being driven by the constant current. Therefore, no additional temperature compensating circuit is required to perform temperature compensation on a Hall signal, and the compensating circuit has a simple design and occupies a small space of the integrated circuit.

The magnetic sensing element is a Hall element. Preferably, as shown in FIG. 3, the magnetic sensor integrated circuit may further include: an AC-DC converter 302 connected to the signal processor 303 and the current source generator 201 respectively. The AC-DC converter 302 is connected to an urban power system, and is configured to convert an alternating current voltage into a low direct-current voltage, provide a reference voltage for the bandgap reference voltage source 202 and supply power to the signal processor 303.

Figure 4:
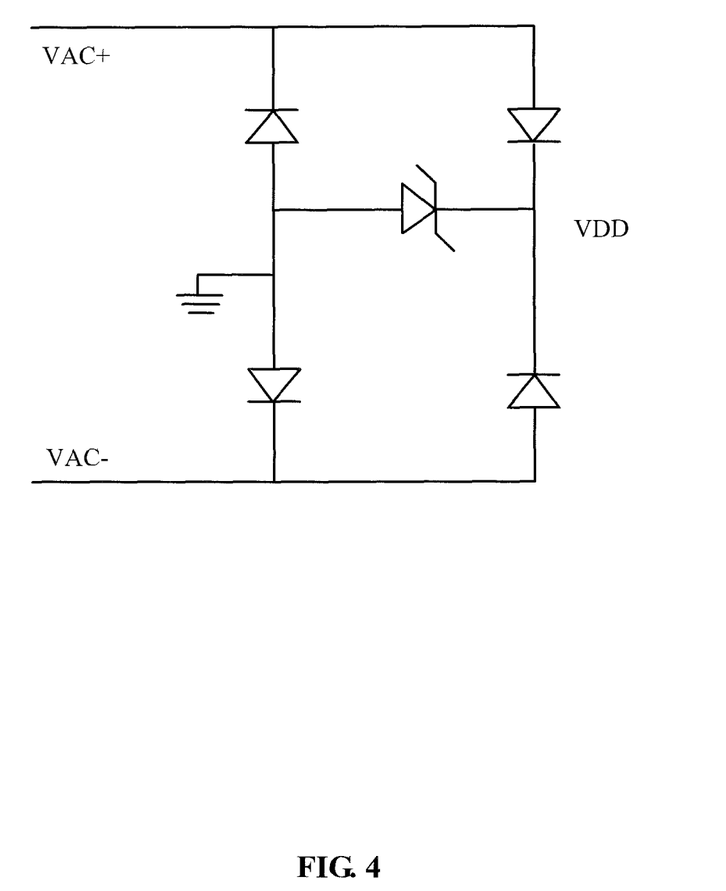
FIG. 4 is a schematic structural diagram of an AC-DC converter according to one embodiment.

A voltage outputted by the AC-DC converter described above is a direct current voltage of 3 to 18V. FIG. 4 shows a schematic structural diagram of a bridge rectifier circuit in the AC-DC converter according to one embodiment.

The high alternating-current voltage from the urban power system converted into a low direct-current voltage (which is preferably 3 to 18V) via a bridge rectifier circuit and a low-dropout linear regulator. As shown in FIG. 4, the bridge rectifier circuit includes a third diode and a fourth diode reversely connected in parallel between VAC+ and VAC− via a first diode and a second diode respectively. A Zener diode is provided between the third diode and the fourth diode to stabilize a voltage.

Figure 5:
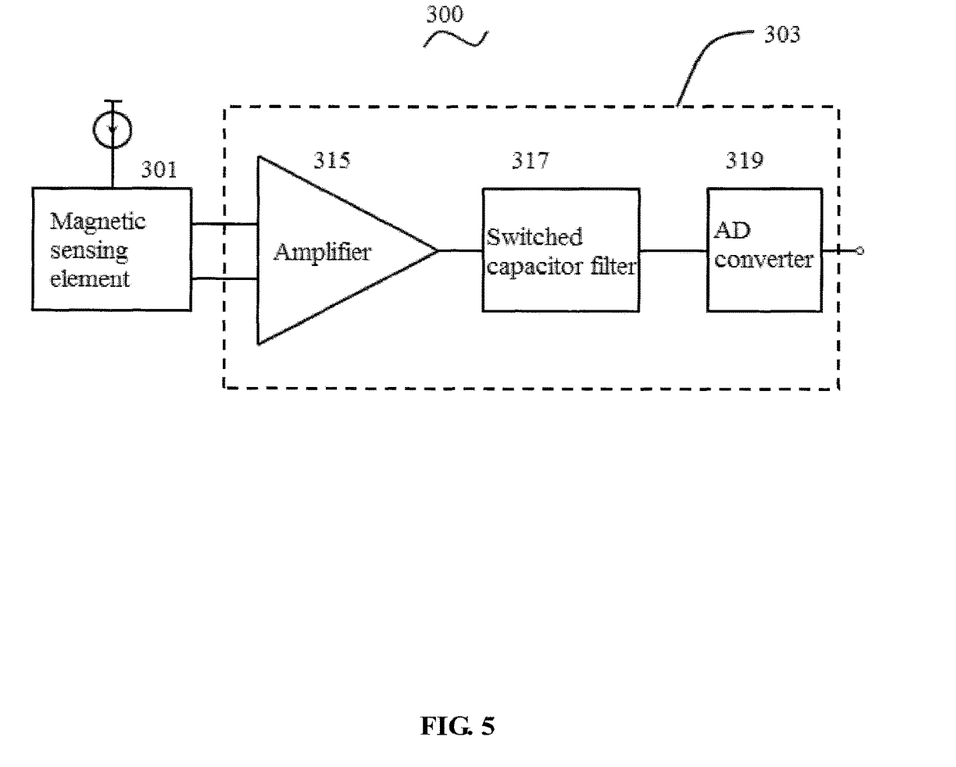
FIG. 5 is a schematic structural diagram of a magnetic sensor according to one embodiment.

FIG. 5 shows a schematic structural diagram of a magnetic sensor according to one embodiment. The signal processor 303 includes: an amplifier 315, a switched capacitor filter 317 and an analog-to-digital (AD) converter 319. The amplifier 315 is configured to amplify the magnetic field sensing signal. The magnetic field sensing signal can include a magnetic field signal and a deviation signal. The switched capacitor filter 317 is configured to sample and filter the magnetic field sensing signal which is outputted by the magnetic sensing element and amplified by the amplifier 315, to eliminate the deviation signal. The AD converter 319 is configured to convert a filtered signal outputted by the switched capacitor filter 317 into a switch-type control signal. In the embodiment, the amplifier 315 is a chopper amplifier. The AD converter 319 includes a hysteresis comparator and a latch.

Figure 6:
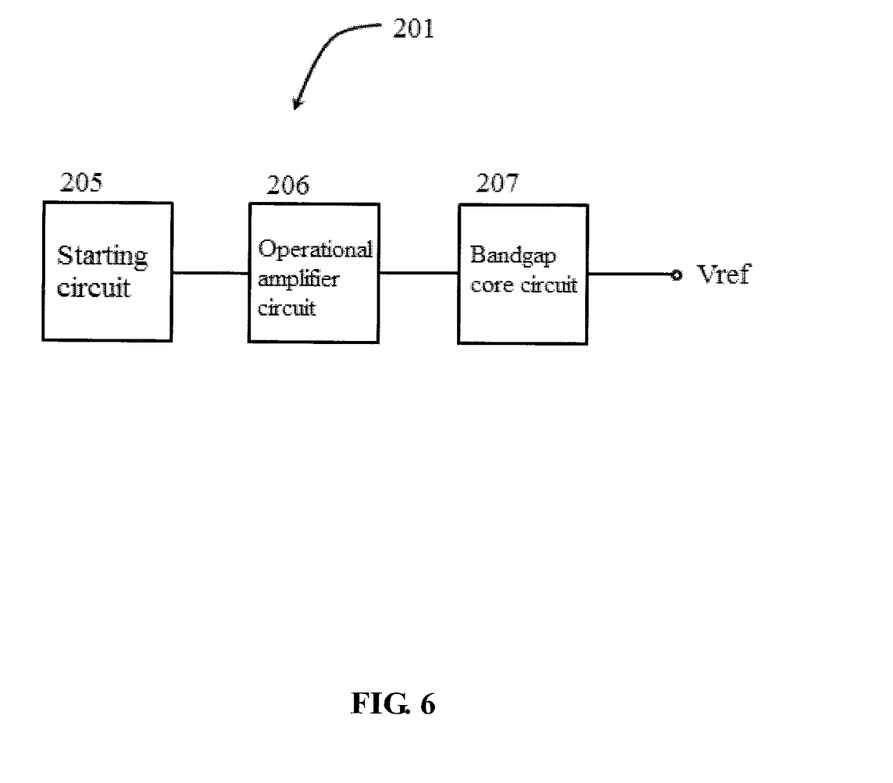
FIG. 6 is a schematic structural diagram of a bandgap reference voltage source according to one embodiment.

FIG. 6 shows a structural diagram of a circuit of the bandgap reference voltage source according to one embodiment. The bandgap reference voltage source 202 includes: a starting circuit 205, an operational amplifier circuit 206 and a bandgap core circuit 207. An output bias terminal of the starting circuit 202 is connected to the operational amplifier circuit 206 and the bandgap core circuit 207. The starting circuit 202 provides a stable voltage bias point, to cause the operational amplifier circuit 206 and the bandgap core circuit 207 to operate at a suitable quiescent operation point, thereby starting the whole bandgap reference voltage source circuit. The bandgap reference voltage source 201 outputs a reference voltage Vref via an output terminal. The bandgap core circuit is a bipolar junction transistor circuit, and includes at least two triodes. An area of an emitter of one triode is at least two times of an area of an emitter of another triode. The bandgap reference voltage source outputs at least one current such as I1, I2 and I3 via the at least one resistor 203. In addition, the bandgap reference voltage source outputs a constant current I_Hall via the temperature compensating resistor 204.

Figure 7:
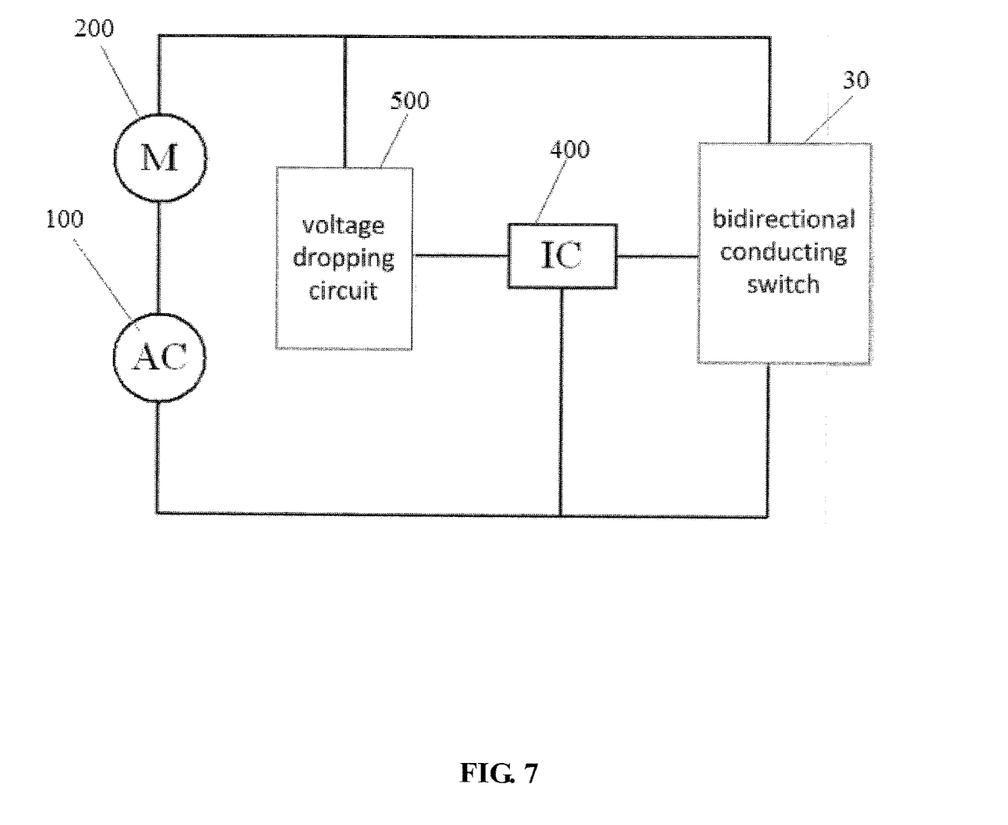
FIG. 7 is a schematic structural diagram of a circuit of a motor assembly according to an embodiment of the present disclosure.

As shown in FIG. 7, a motor assembly is further provided according to one embodiment. The motor assembly includes a motor 200 powered by an alternating-current power 100, a bidirectional conducting switch 30 electrically connected to the electric motor 200 in series, and a magnetic sensor integrated circuit 400 according to any one of the above embodiments of the present disclosure. An output port of the magnetic sensor integrated circuit 400 is electrically connected to a control end of the bidirectional conducting switch 30. Preferably, the bidirectional conducting switch 30 may be a triode alternating current switch (TRIAC). Preferably, the electric motor further includes a voltage-dropping circuit 500 to drop the voltage of the alternating-current power 100 and provide the dropped voltage to the magnetic sensor integrated circuit 400. The magnetic sensor integrated circuit 400 is arranged in proximity to a rotor of the motor 200 to sense a polarity of a magnetic field of the rotor.

Figure 8:
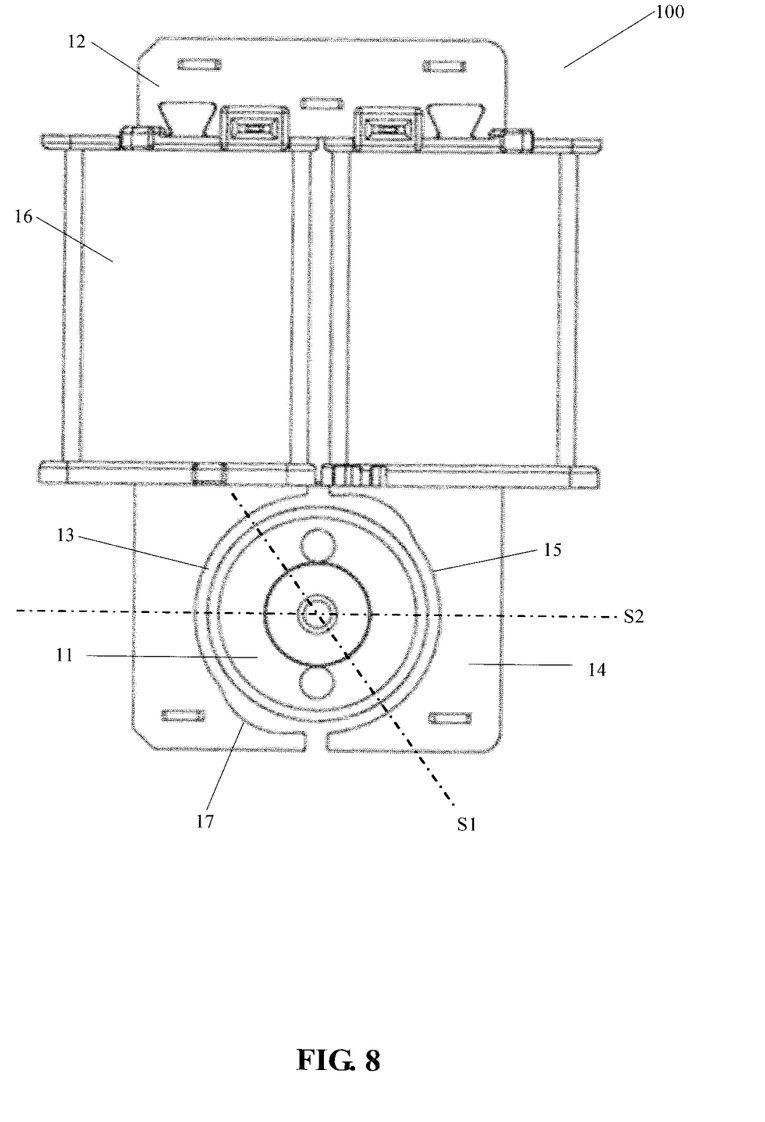
FIG. 8 is a schematic structural diagram of a synchronous motor according to an embodiment of the present disclosure.

Based on the above embodiment, in an embodiment of the present disclosure, the electric motor is a synchronous motor. It can be understood that, the magnetic sensor integrated circuit according to the present disclosure is not only applied in the synchronous motor, but also applied in other types of permanent magnet electric motor such as direct-current brushless motor. As shown in FIG. 8, the synchronous motor includes a stator and a rotor 11 rotating with respect to the stator. The stator includes a stator core 12 and a stator winding 16 wound around the stator core 12. The stator core 12 may be made of soft magnetic material such as pure iron, cast iron, cast steel, electrical steel and silicon steel. The rotor 11 includes a permanent magnet. When the stator winding 16 is electrically connected to the alternating current power in series, the rotor 11 rotates with a constant speed of a constant rotation rate of (60 f/p) rpm in a steady state, where f is a frequency of the alternating-current power, and p is a number of pole-pairs of the rotor. In the embodiment, the stator core 12 has two pole portions 14 arranged oppositely. Each of the pole portions has a polar arc surface 15. An external surface of the rotor 11 faces the polar arc surface 15, and a substantially uniform air gap is formed therebetween. The basically uniform air gap in the present disclosure indicates that majority of the air gap between the stator and the rotor is uniform, and minority of the air gap between the stator and the rotor is non-uniform. Preferably, a concave starting groove 17 is arranged on the polar arc surface 15 of the pole portion of the stator. Portions other than the starting groove 17 on the polar arc surface 15 are concentric with the rotor. With the above configurations, a non-uniform magnetic field may be formed which ensures that when the rotor does not rotate, a polar axis S1 of the rotor is tilted with an angle with respect to a central axis S2 of the pole portion of the stator, so that the rotor can have a starting torque each time when the electric motor is powered on under an effect of the integration circuit. The polar axis S1 of the rotor is a boundary between two magnetic poles of the rotor with different polarities. The central axis S2 of the pole portion 14 of the stator is a connection line passing through centers of the two pole portions 14 of the stator. In the embodiment, the stator and the rotor each have two magnetic poles. It can be understood that, in other embodiments, the number of magnetic poles of the stator may be different from the number of magnetic poles of the rotor, and the stator and the rotor may have more magnetic poles such as four magnetic poles and six magnetic poles.

In the embodiment, in operation, the bandgap reference voltage source provides a stable and highly accurate reference voltage of 1.25V for the system. As the temperature compensating resistor is connected in series with the bandgap reference voltage source, the constant current which is not influenced by the temperature is outputted to the magnetic sensing element, and the sensitivity of the magnetic sensing element is hardly influenced by the temperature when being driven by the constant current. Therefore, no additional temperature compensating circuit is required to perform temperature compensation on a Hall signal, resulting in a reduced area of the integrated circuit.

In summary, in the magnetic sensor integrated circuit of the present disclosure, as the temperature compensating resistor is connected in series with the bandgap reference voltage source, the constant current which is not influenced by the temperature is outputted to the magnetic sensing element, and the sensitivity of the magnetic sensing element is hardly influenced by the temperature when being driven by the constant current. In addition, with the magnetic sensor integrated circuit according to the present disclosure, no additional temperature compensating circuit is required to perform temperature compensation on a Hall signal, and the compensating circuit has a simple design and occupies a small space of the integrated circuit.

It should be noted that, the various embodiments of the specification are described in a progressive manner, differences from other embodiments are emphatically illustrated in each of the embodiments, and reference can be made to each other for understanding the same or similar sections.

The above descriptions of the disclosed embodiments enable those skilled in the art to implement or use the present disclosure. Various changes to the embodiments are obvious to those skilled in the art and general principles defined herein may be implemented in other embodiments without departing from the spirit or scope of the present disclosure. Therefore, the invention is not limited to the embodiments disclosed herein, but is to conform to the widest scope consistent with the principles and novel features disclosed herein.

The invention claimed is:

1. A magnetic sensor integrated circuit, comprising:
a magnetic sensing element detecting a polarity of an external magnetic field and outputting a magnetic field sensing signal;
a signal processor processing the magnetic field sensing signal and outputting a magnetic field detection signal; and
a current source generator outputting a constant current, which is not influenced by a temperature, to the magnetic sensing element, wherein the current source generator comprises a voltage source, at least one ordinary resistor connected in series to the voltage source and a temperature compensating resistor connected to the voltage source, and the voltage source outputs the constant current to the magnetic sensing element via the temperature compensating resistor, and outputs at least one current to the signal processor via the at least one ordinary resistor; wherein the at least one ordinary resistor is connected with the temperature compensating resistor in parallel; wherein the sensitivity of the magnetic sensing element is substantially maintained as a temperature changes when being driven by the constant current.

2. The magnetic sensor integrated circuit according to claim 1, wherein the voltage source is a bandgap reference voltage source which converts a direct current voltage and output a reference voltage.

3. The magnetic sensor integrated circuit according to claim 1, wherein the temperature compensating resistor comprises a positive temperature coefficient compensating resistor and a negative temperature coefficient compensating resistor connected in series.

4. The magnetic sensor integrated circuit according to claim 3, wherein the positive temperature coefficient compensating resistor is a first doping type of polysilicon resistor, and the negative temperature coefficient compensating resistor is a second doping type of polysilicon resistor.

5. The magnetic sensor integrated circuit according to claim 2, wherein the bandgap reference voltage source is a bipolar junction transistor core circuit.

6. The magnetic sensor integrated circuit according to claim 5, wherein the bipolar junction transistor core circuit comprises at least two triodes.

7. The magnetic sensor integrated circuit according to claim 1, wherein the signal processor comprises:
an amplifier amplifying the magnetic field sensing signal;
a switched capacitor filter sampling and filtering the magnetic sensing signal to eliminate a deviation signal; and
an analog-to-digital converter converting a filtered signal processed by the switched capacitor filter into a switch-type detection signal.

8. The magnetic sensor integrated circuit according to claim 7, wherein the amplifier is a chopper amplifier.

9. The magnetic sensor integrated circuit according to claim 1, wherein the magnetic sensing element is a Hall element.

10. The magnetic sensor integrated circuit according to claim 1, further comprising:
an AC-DC converter converting an alternating current voltage into a direct current voltage and providing the direct current voltage for the current source generator.

11. A motor assembly, comprising the magnetic sensor integrated circuit according to claim 1.

12. An application device, comprising the motor assembly according to claim 11.

13. The application device according to claim 12, wherein the application device is a pump, a fan, a household appliance or a vehicle.

14. The magnetic sensor integrated circuit according to claim 1, wherein the first doping type of polysilicon resistor is an N+ type of polysilicon resistor, and the second doping type of polysilicon resistor is a P+ type polysilicon resistor.

* * * * *